United States Patent [19]

Sullivan

[11] Patent Number: 4,954,421

[45] Date of Patent: Sep. 4, 1990

[54] PHOTOFLASHING A LIQUID POLYMER LAYER ON A PHOTOTOOL SURFACE EXPOSED TO AIR

[75] Inventor: Donald F. Sullivan, Paradise, Pa.

[73] Assignee: M&T Chemicals Inc., Woodbridge, N.J.

[21] Appl. No.: 847,188

[22] Filed: Apr. 2, 1986

Related U.S. Application Data

[63] Continuation-in-part of Ser. No. 147,726, May 8, 1980, Pat. No. 4,669,869, and a continuation-in-part of Ser. No. 672,500, Nov. 19, 1984, which is a continuation-in-part of Ser. No. 364,309, Apr. 1, 1982, Pat. No. 4,506,004.

[51] Int. Cl.$^5$ .............................................. G03C 1/78
[52] U.S. Cl. .................................... 430/271; 430/311; 430/312; 430/322; 430/325; 430/327; 430/394
[58] Field of Search ............... 430/311, 322, 327, 328, 430/325, 394, 935, 27 P, 312

[56] References Cited

U.S. PATENT DOCUMENTS 4,528,261  7/1985  Hauser ................................. 430/322

Primary Examiner—John E. Kittle
Assistant Examiner—JoséG. Dees
Attorney, Agent, or Firm—S. A. Marcus; S. H. Parker; R. E. Bright

[57] ABSTRACT

A liquid photopolymer layer covering a phototool image surface with one surface exposed to air is exposed by radiation through the phototool to partially harden in a pattern defined by the image the photopolymer layer through a part of its thickness. The air exposed surface portion is thus left in liquid form for contacting the surface of a printed wiring board, preferably by scanning along the length of a phototool with a pressurized roll or blade to contact and adhere the preimaged laminate to board surface in an air bubble free lamination where subsequent radiation exposure finishes the curing and bonds the cured portion of the polymer layer to the PWB substrate. After removal of the phototool, the polymer layer is developed by washing out uncured polymer portions as defined by the image pattern.

8 Claims, 2 Drawing Sheets

PHOTOFLASHING A LIQUID POLYMER LAYER ON A PHOTOTOOL SURFACE EXPOSED TO AIR

This application is a continuation-in-part of application Ser. No. 147,726 filed May 8, 1980, U.S. Pat. No. 4,669,869 and of application Ser. No. 672,500 filed Nov. 19, 1984 which is a continuation-in-part of Ser. No. 364,309 filed Apr. 1, 1982, now U.S. Pat. No. 4,506,004 granted Mar. 19, 1985 and the disclosure hereof includes the entire subject matter of the present cases by reference.

TECHNICAL FIELD

This disclosure teaches a new process and apparatus for producing graphic images on substrates, using photopolymers such as paste-consistency ultraviolet light (UV) curable photopolymers. These photopolymers are characterized by their composition of 100 percent reactive polymers, which are transformed from a paste-consistency wet film to a dry coating by exposure to a strong UV light source for several seconds. The photopolymers as used in the disclosed process are further characterized as being imaging quality, or capable of being selectively hardened by light passing through a photographic master, thereby producing a film securely affixed to a substrate, at locations where the photographic master allows the UV light to impinge on the photopolymer.

The photopolymers which can be imaged by the disclosed process and apparatus are of known composition, a representative list being included herein. These photopolymers are available commercially as plating resists and as etch resists for use in printed wiring board (PWB) manufacture, for example. These photopolymers are also used extensively in graphic imaging and are being applied conventionally by screen printing.

This class of photopolymers known as negative acting liquid photopolymers has been developed to be applied to substrates via screen printing, wherein the images are deposited on the substrates as wet photopolymer, and are then hardened and transformed into permanent images by subjecting to a strong UV light source.

BACKGROUND ART

Negative acting liquid photopolymers been used for producing printed wiring boards as evidenced by my U.S. Pat. No. 4,260,675 of Apr. 7, 1981 for PHOTOPRINTING PLATE AND METHOD OF PREPARING PRINTED CIRCUIT BOARD SOLDER MASKS THEREWITH. Prior to that time little use of these liquid photopolymers had been made for high resolution printed wiring boards.

Prior to the effective filing date of this application, namely May 8, 1980, there was no significant use of photopatterned liquid photopolymers for printed wiring boards, nor had their been any usage in the printed circuit arts of direct contact printing by contact of the phototool with the liquid photopolymer surface.

Thus, applicant has first introduced the method herein set forth and claimed wherein liquid polymers are photoimaged onto printed wiring boards.

BACKGROUND OF THE INVENTION

It has been difficult in the prior art to obtain proper results with liquid photopolymer layers photoprinted onto printed wiring boards to produce masking layers because of several problems.

One significant problem is the disposition of the liquid photopolymer layer onto the printed wiring board surface without entrapping air bubbles, which ruin resolution and adherence, particularly for high resolution requirements in the order of 100 lines per inch or more. This is particularly evident in the case of solder mask coatings which have to cover rough raised circuit conductors on the board surface, where air bubbles are apt to become trapped adjacent the conductor lines.

Another problem is that of tenting through holes on the board surfaces. The liquid polymer, paste-like in consistency tends to flow or droop into the holes and thus adequate tenting over of the holes is a critical process.

These problems have not been addressed by the prior art.

DISCLOSURE OF INVENTION

The objectives of this invention are to provide a new industrial process and apparatus which will significantly improve the art of image formation on substrates, in which a significant image thickness is required, through the use of photopolymers which are applied in the wet state and converted to a hardened polymerized state by exposure to light.

Objects are to achieve a photoimaged PWB solder mask in which liquid photopolymers are exposed with a photomask in contact with the liquid and in which the solder mask coating is not thinned out over the metal conductors, and to laminate a layer of hardened photopolymer over a highly irregular surfaced PWB in an air bubble free contact without the use of a vacuum laminator.

One objective is to mate the photopolymer-coated phototool with the substrate so as to exclude air from the photopolymer.

Another objective is to provide a way to coat a non-wetting surface, in such a way that the applied photopolymer does not develop fish-eyes or voids.

The process comprises the steps of preparing a phototool (or photomask) which describes the images to be reproduced on the substrate-facing surface of a flexible carrier surface; the coating of the phototool with a thin layer of liquid photopolymer; the partial polymerization of the photopolymer by radiation through the photoimage with one polymer surface exposed to air; the placement of the phototool above and off-contact to the substrate being imaged; and the mating of the phototool with the substrate so as to exclude all air by use of a resilient blade drawn across the topside of the phototool.

Typically the substrate to which is laminated a photo developed insulating pattern layer of photohardenable material, preferably a liquid photopolymer of paste-like consistency, is a printed wiring board. By providing a flexible photomask of a material such as a thin film sheet of clear polyester for receiving a deformable uncured liquid polymer layer, the liquid surface of the layer may be laminated onto the substrate surface by applying to the flexible photomask a resilient blade or roller advancing the pressure across the mask to force the liquid polymer into mating contact with the substrate and forcing out ahead all the air and that excess polymer material on the phototool that is necessary to assure the desired thickness layer and the lack of residual entrapped air bubbles.

Before laminating the liquid polymer layer on the substrate, for the aforesaid purposes of tenting over holes and for the purpose of assuring that there is no starvation of the liquid polymer over raised conductor wires, for example, in a solder mask layer, the layer is partially cured in place on the phototool by photoflashing. Thus, by exposing to air one surface of the liquid polymer, which is of a type being oxygen inhibited to curing by radiation, and radiating with a controlled amount of actinic radiation through the photomask image pattern, the layer becomes hardened part way through leaving the surface which faces away from the mask deformable in liquid polymer state.

This then permits the advancing pressure of the roller nip or blade to force a liquid layer of polymer onto the substrate surface to form in situ a registered in place preimaged laminate. Preferably an appropriate jig or frame maintains the registration position between the phototool and printed wiring board surface.

When the phototool and accompanying partially exposed layer of polymer is in place in the air bubble free surface contact with the substrate, the layer is reexposed by the actinic radiation through the photomask, with the air excluded from the liquid polymer surface, so that it cures and hardens in place to bond the discrete areas defined by the pattern to the substrate surface.

The phototool is then stripped from the cured pattern, and may be reused for other cycles, where a non-stick material may be superposed between the phototool and the liquid polymer layer, if desired. The polymer is then developed to remove the unexposed unhardened discrete areas defined by the phototool image pattern, leaving the desired masking coating of insulation material bonded to the substrate.

The invention is not limited to any particular embodiment. For example, both sides of substrate printed wiring board may be conventionally processed at the same time with this invention, and the paste-like consistency may be either vertically or horizontally oriented as shown in the drawings. The photopolymers may have appropriate additives to enhance the oxygen inhibition characteristic or for other purposes, such as to provide better adherence to copper wires on a printed wiring board.

To the extent useful or necessary the full text of the parent applications above identified is incorporated into this application by reference.

BRIEF DESCRIPTION OF THE DRAWINGS

Further background, objects, advantages and features of the invention will be set forth throughout the following specification with reference to the accompanying specification with reference to the accompanying drawings wherein.

DESCRIPTION OF PREFERRED EMBODIMENTS

Curing

Negative acting UV curable photopolymers used in PWB manufacture have been developed to be applied by screen printing over the copper surface and cured by conveying under 200 watt-per inch mercury vapor lamps at a speed of 12 feet (3.66M) per minute. Most all of the tested photopolymers are affected by air to the extent that the exposure energy can be reduced when the air is completely excluded by the mating process described herein.

A phototool, as used herein, is a transparent sheet with light opaque areas corresponding to the image to be reproduced, and this phototool is placed between the UV lamp and the substrate to control those areas of photopolymer to be hardened.

In order to use a non-collimated light source and still achieve fine line imaging, it is necessary for the phototool to intimately contact the photopolymer, as is accomplished herein.

Figure 1:
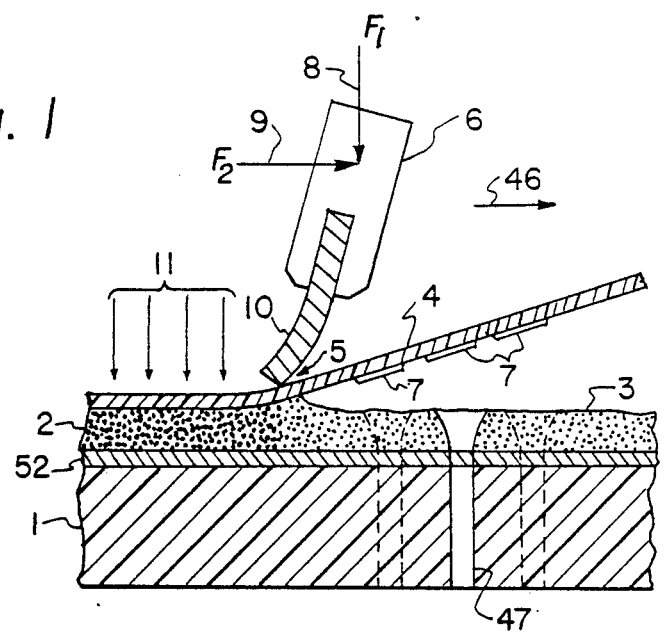
FIG. 1 is a diagrammatic side view sketch, partly sectioned to illustrate the mating of a photo image with a coated substrate by use of a resilient blade as provided by this invention.

FIG. 1 shows a section of a PWB 1 in which the phototool is being mated to the coated surface 3. PWB 1 has been previously roughly coated with photopolymer layer 3. Phototool 4 is positioned above and off contact with PWB 1 with opaque areas 7 registered to drilled holes 47 in the PWB 1. Assembly 6 movable in the direction of arrow 46 has rubber blade 10 of 50 durometer, which traverses the top surface of phototool 4. Force $F_1$ in direction 8 on phototool 4 causes the phototool to contact the photopolymer and force $F_2$ in the direction of movement 9 causes blade 10 to traverse the topside of the phototool and progressively mate the phototool with the photopolymer squeezing out any excess polymer to the edges of the polymer layer.

This technique purges the photopolymer of air bubbles which may have been entrapped during the coating cycle, and also prevents the entrapment of air resident between the phototool and photopolymer surface.

This mating technique has several highly desirable features not readily obtainable otherwise. First, the photopolymer surface, when coated, may be mottled or have an orange-peel effect. These surface irregularities are smoothed out and the mated surface conforms to the smooth plastic surface topology of phototool 4 as well as the substrate. It is necessary to avoid air bubbles to have a slight excess of photopolymer to squeeze some to the sides or edges of the PWB during scanning. This is readily removable in the development stage without special attention. In the case of a PWB the substrate carries a copper layer 52 surface which is to be conformed to the image of the phototool 4, for example. This is illustrated in FIG. 1 with crosshatched photopolymer area 2 being in surface to surface contact because of the previous scanning of surface contact member 10, preferably a rubber blade, across the phototool 4 surface.

At the point 5 where the blade edge contacts the phototool, the instantaneous pressure may reach 300 pounds per square inch (2067 kPa). This high pressure causes any trapped air bubbles to burst and the air is forced out ahead of the blade.

Experiments with the substitution of a rubber roller in the manner of U.S. Pat. No. 3,837,887—K. Akamatsu et al., Sept. 24, 1974 in lieu of the blade yielded inferior results, for air was entrapped under the phototool.

However, in general, this rubber roller is an equivalent member.

On those areas of the phototool now mated with the (crosshatched) photopolymer, a strong holding force is maintained between the phototool and PWB surface. Thus, interfacial or viscous forces with atmospheric pressure 11 (FIG. 1) maintains the phototool in intimate contact with the photopolymer surface indefinitely, without an outside vacuum source. Phototool opaque areas 7 (which usually do not constitute surface irregularities) are in intimate contact with the photopolymer surface, and the photopolymer can be exposed with a non-collimated light source and produce high fidelity reproduction of images on the phototool on the PWB plating resist pattern.

Phototool

Referring to FIG. 1, phototool 4 is seen to be subjected to a horizontal force 9 which tends to stretch the phototool and thereby introduce registration errors. Polyester sheet in the thickness of 4 to 8 thousandths of an inch (0.1 to 0.2 mm) provides the stability needed by the phototool, plus the ability to withstand short temperature excursions to 250 degrees F.

Thus far in this disclosure, the use of a flexible phototool has been described. The phototool need not be flexible in all cases. For example, when imaging flexible printed wiring circuits, the phototool may be a glass plate and the flexible substrate mated with the phototool by drawing the blade across the flexible substrate. Thus, in the frame of FIG. 3, simply the substrate and phototool are interchanged in position. The photo scanning need then occur on the opposite side.

Light Source

Figure 3:
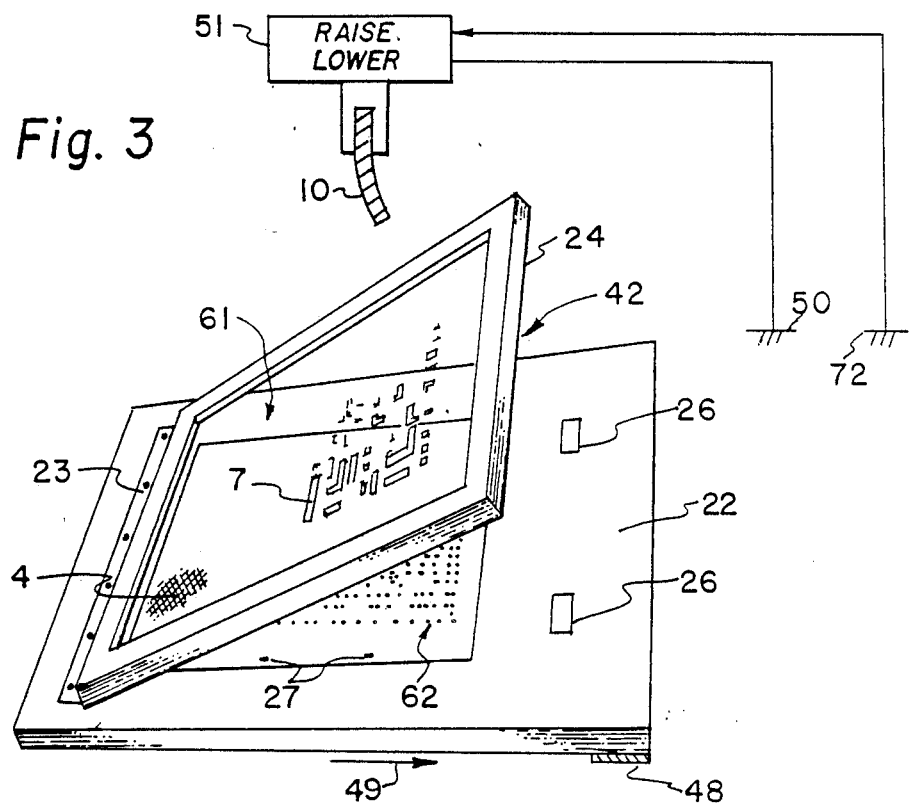
FIG. 3 is a perspective sketch of a figure for mounting the photo image and the substrate in register prior to being mated together.

FIG. 3 shows a fixture for mounting the phototool and PWB in register and off contact.

The fixture shown in FIG. 3 is used when precise registration is required, when a conveyorized UV curing unit is used as the exposure source, or when a pre-registered fixture is needed, but the steps of FIG. 3 can be carried out by hand without the need of a fixture.

In the fixture 42, PWB 1 mounts on base 22 and is registered via pins 27. Phototool 4 is mounted on frame 24 which maintains the phototool in registration with drilled PWB 1. Hinge 23 allows frame 24 to be raised and lowered for placement and removal of PWB 1. Spacers 26 maintain off-contact distance between phototool 4 and PWB 1 top surface.

In FIG. 3, mounting base 22 has a metal strip 48 affixed to the under side, whose purpose is to cause the generation of an electrical signal when the exposure assembly is conveyed in direction 49 past a sensor 50 serving to actuate a lowering mechanism at control center 51 for positioning the mating blade 10. A similar electrical signal at 72 will in turn cause the mating blade to rise. Thus contact of the phototool at the leading edge of the image area with the blade 10 may be automated.

IMAGING SEQUENCE

The following chart shows the process steps of this invention to be followed where hole tenting is not required:
 a. prepare phototool and install in the fixture;
 b. coat the drilled PWB with paste photopolymer;
 c. install PWB in registration on the fixture;
 d. mate the phototool with the PWB to form a sandwich;
 e. expose the PWB to UV light through the phototool;
 f. separate the phototool from the PWB leaving hardened photopolymer on PWB;
 g. wash out unexposed paste photopolymer on PWB and post cure if desirable;
 h. blot the phototool to remove any photopolymer paste adhering thereto, and reinstituting the cycle.

Step a, phototool preparation is accomplished as previously described.

The PWB is coated, Step b, by screen printing to the desired thickness, normally from 0.5 to 2 thousandths of an inch (0.013 mm to 0.051 mm), as determined by plating bath requirements (temperature, immersion time, plating current density and chemical composition), and the plating thickness to be deposited. The photopolymer thickness is controlled primarily by the screen fabric thickness and percent open area. For example, a 156 mesh polyester fabric will coat the PWB to a thickness of approximately 1 mil, while a 230 mesh fabric will deposit a coating 0.3 mils (0.076 mm) thick.

The phototool is maintained off-contact, but correctly positioned above the coated PWB by the fixturing as shown in FIG. 3. Off contact distance is of the order of 0.060 inches (0.15 cm) for a 12 by 18 inch (0.3 by 0.46 M) PWB. The frame or jig holds the photomask in registration with the printed wiring board so that no relative movement occurs to deregister but only a downward displacement to provide intimate contact with the liquid polymer and the substrate surface 62. Thus, the photomask and substrate sandwich therebetween a registered preimaged laminate of the partially exposed polymer layer.

The phototool is mated with the coated PWB by pressing the blade down at one end of the PWB and drawing the blade across the PWB length, using a downward force of 2 pounds (8.9N) per linear inch (2.54 cm) of blade length.

Whatever excess material is extruded off the conductors and is left at the edges of the phototool pattern will cause no concern, since it will result in only a small variation of marginal boundary lines outside the circuit pattern area and will be washed away in the development step.

Step e, exposure to UV light source, may be accomplished independently or concurrently with the phototool mating Step d to bond the cured polymer to the PWB substrate. Alternatively, the positioning fixture (with mated phototool) may be exposed to a remote light source. As previously described, the mating process forces out all air from the photopolymer, and all air from between the phototool and photopolymer surface, producing a vacuum. This vacuum is maintained indefinitely, provided the phototool does not start to lift away at the PWB edge in response to the upward pull of the phototool.

Thus, without the use of an external vacuum source, the mated phototool PWB can be exposed to various light sources to effect polymerization.

If desired, the phototool has a thin layer of clear silicone rubber on the underside. When a coating of photopolymer is applied by screen printing (or other means) onto the silicone rubber, the phototopolymer will develop "fish-eyes" or voids which will continue to expand in area with time. This is caused by the inability of the wet photopolymer to grip the silicone rubber, and the photopolymer surface tension causes the photopolymer to form beads, similar to the beading of water on a waxed surface.

In order to prevent the formation of fish-eyes or voids, the disclosed apparatus exposes or flashes the photopolymer through the phototool as the coating is being applied, or alternatively after the coating has been applied. This flashing step is of sufficient intensity to slightly polymerize the photopolymer over the clear areas of the phototool, but not to the point of exterior surface hardening. That photopolymer above the phototool opaque areas need not be flashed.

It would appear that this flashing step is critical with regard to lamp intensity and exposure time, but in practice it is not. The photopolymers listed in this disclosure, and all photopolymers tested are air-inhibited, meaning that the photopolymer cure with less UV energy in the absence of air than is required in the presence of air. Thus, as the phototool is coated with photopolymer via screen printing, only a thin line of photopolymer immediately under the squeegee is deprived of air, for the screen fabric is off-contact, and touches the phototool only along a line underneath the squeegee. Previously deposited photopolymer, though exposed, will retain a wet surface for good adhesion to the substrate to be printed. Similarly, when the flashing step is accomplished after the completion of the flashing step the flashed photopolymer will be partially polymerized but will retain a wet surface to ensure adhesion to the substrate in a subsequent step. This flashing technique is an important aspect of tenting holes in PWB resist imaging, for the flashing ensures a thicker film over the tented hole than would be attained without flashing, for without flashing the photopolymer would thin out at the edges of the holes and would be more likely to break down during washout and immersion in the plating solution. When tenting holes 47 in FIG. 1 the photopolymer layer 3 is applied to the phototool 4 underside and the corresponding opaque image 7 is omitted so that the photopolymer overlying hole 47 will be pre-exposed to form a partially polymerized film.

This flashing step has produced a polymerized image which is hardened on the phototool side, but wet on the exterior side, so that the next step of phototool mating with the substrate can be considered to be an image transfer technique.

It is understood that in the present specification "substantially no movement" means that the surface of the substrate and the photomask do not move relative to one another in directions parallel to their surfaces, i.e., the surfaces do not slide relative to one another to change the alignment of the photomask to the substrate. However, it is understood that "substantially no movement" allows relative movement of the photomask and the substrate layer in the direction perpendicular to their surfaces, e.g., as excess unhardened liquid is squeezed from the interface between the substrate and the photomask to form the preimaged photosensitive layer or as the outer strata of the preimaged layer is deformed. However, the substrate layer and photomask, contacted to the preimaged photosensitive layer by the advancing pressure line, remain in a fixed relationship in directions parallel and perpendicular to their surfaces.

Also, it is understood in the present specification that "contacting" through the preimaged photosensitive liquid layer a substrate and a photomask does not exclude intermediate layers.

Figure 2:
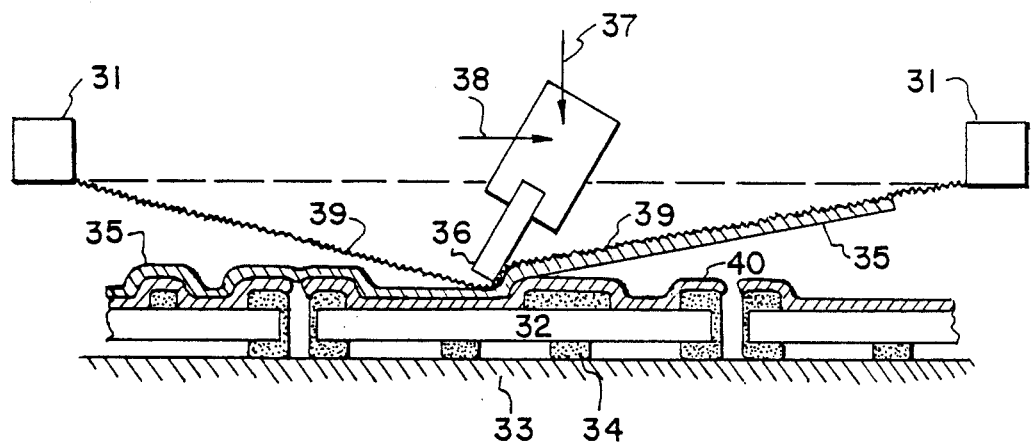
FIG. 2 is a sectional cut-away showing the lamination of a solder mask film comprising two photopolymer layers over printed wiring on a board.

This embodiment of FIGS. 1 and 4 from the parent case Ser. No. 147,726 proposes a single layer of photopolymer film. However, in a similar manner two film layers may be processed as shown in the embodiment of FIGS. 2 and 3 from Ser. No. 672,500.

Reference is made to FIG. 2, a partial sectional cutaway drawing of the PWB being laminated. PWB 32 with metal conductors 34 rests on surface 33. Screen frame members 31 tension and restrain polyester fabric 39. A photopolymer outer layer 35 is shown mated with the PWB behind blade 36 and adhered to screen fabric 39 ahead of the blade. Force 37 causes blade 36 to move downward, forcing photopolymer 35 to contact liquid polymer layer 40 resident on the PWB 32. Force 38 causes blade 36 to scan the length of PWB 32. Dry photopolymer 35 is temporarily adhered to fabric 39 by a light adhesive coating, not shown. Liquid photopolymer 35 is retained by screen fabric 39 in a conventional manner.

After lamination, the composite is moved away from fabric 39 and then exposed to a strong UV light source through a photographic film positive, thereby hardening the wanted dry film solder mask and the underlying liquid photopolymer.

When photoimaging a liquid photopolymer, to obtain high resolution it is preferable to use a contact system, whereby the photographic film is pressed into intimate contact with the photopolymer during the exposure cycle. When the paste consistency liquid photopolymer is covering a PWB having a highly irregular surface topology, there is the problem of photopolymer starvation or thin-out over the conductors, for pressure on the phototool forces the photopolymer to extrude sidewards and off the conductors.

Photopolymer starvation of the liquid polymer outermost layer in this disclosure is prevented by use of a composite solder mask, wherein the outer layer is formed on the surface of an image-bearing photomask or photographic film positive containing opaque dots on a transparent field. This outer layer is deposited onto the photomask surface to a thickness of 0.001 inch by screen printing. Exposure to a UV light source through the photomask partially hardens the lightstruck photopolymer. The photomask is then mated with a PWB which may be coated overall with a thin layer of paste consistency solder mask photopolymer, in register, so that the phototool opaque areas are positioned over the PWB circuit conductor pads which are to be free of hardened solder mask. Mating is best accomplished by use of a resilient blade. The partially hardened photopolymer does not extrude from the top of the conductors. The assembly is exposed to a strong UV light source through the mated photomask, so as to harden the photopolymer down to the PWB base laminate. The solder mask is completed by removing the phototool and subjecting the PWB to a solvent spray bath to remove unhardened photopolymer and then final curing with a UV curing unit.

Figure 1 these are shows the processing steps to be followed.

Step 1 is to prepare a special photomask which may have a non-stick release surface coating, and which will withstand the high temperature of the light source, while maintaining dimensional stability. The photomask consists of a clear polyester sheet having opaque images and stretched in a four-sided frame.

Next, the PWB is coated by screen printing with W. R. Grace "Unimask 1000" photopolymer, using a 125 mesh fabric to deposit a 0.001 inch thickness. The same screen mesh is used to coat the photomask overall with a 0.001 inch thick coating when an under layer is preferred.

Step 3 is to partially harden the wanted photopolymer on the photomask. The partially polymerized photopolymer does not readily extrude from conductor traces and also improves the tenting of photopolymer over selected holes in the PWB. A two-minute exposure with the Colight "DMVL-HP" is used. Step 4; place the photomask over the coated or uncoated PWB off-contact and in register. Step 5; mate the wet photopolymer surface to the PWB substrate with the resilient blade. Step 6; expose the mated composite to partially harden on the PWB. Step 7; remove the photomask. Step 8; wash out the unhardened photopolymer with developer. Step 9; final cure.

I claim:

1. In the method of producing intermediate products used in printing on a substrate surface an insulation pattern formed by a polymer coating, the steps of disposing on an image bearing photographic film transparency a layer of liquid photopolymer with its outer surface exposed to air, exposing the layer with that amount of curing radiation passed through the film to partially expose the layer through its thickness and harden portions in a pattern corresponding to the image on the film and leaving the layer surface exposed to air in liquid polymer uncured state for contact with said substrate surface as an intermediate liquid polymer layer between the outercured polymer layer and the substrate.

2. The method defined in claim 1 including the step of adhering the uncured liquid polymer surface to the substrate.

3. The method defined in claim 2 including the step of adhering the uncured liquid polymer surface over a substrate surface in an air bubble free surface contact.

4. The method defined in claim 3 wherein the substrate surface is a printed wiring board with raised conductors formed thereon in a pattern.

5. A process of applying to a substrate and exposing a photohardenable material to obtain discrete areas of photohardened material on the substrate comprising the steps of:
    (a) applying to a flexible photomask a photohardenable material which is deformable and which is not present as a solid with said material applied in the amount necessary to form a layer in step (c);
    (b) exposing a portion of the photohardenable material to actinic radiation through the photomask whereby the surface of the photohardenable material which faces away from the photomask remains deformable;
    (c) applying exposed and unexposed material with the photomask to a substrate to form a layer whereby the surface of photohardenable material which remains deformable faces the substrate by applying pressure to the flexible photomask and advancing the pressure between the photomask and substrate to form a registered preimaged laminate; and
    (d) reexposing the layer containing photohardenable material to actinic radiation through the photomask whereby bonded discrete areas of photohardened material are obtained on the substrate.

6. A process according to claim 5 wherein a low viscosity 100% reactive photohardenable liquid is applied to the substrate before step (c).

7. A process according to claim 5 wherein the substrate surface contains raised portions.

8. A process according to claim 5 wherein after step (d), the photomask is removed from the surface of the exposed photohardenable material and developer is applied to the surface of the photohardened material whereby unexposed unhardened discrete areas are removed.

* * * * *